(12) United States Patent
Blake, III

(10) Patent No.: US 8,817,481 B2
(45) Date of Patent: Aug. 26, 2014

(54) ASSEMBLY WITH A PRINTED CIRCUIT BOARD

(75) Inventor: Thomas E. Blake, III, Novi, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 68 days.

(21) Appl. No.: 13/249,498

(22) Filed: Sep. 30, 2011

(65) Prior Publication Data

US 2012/0020035 A1  Jan. 26, 2012

Related U.S. Application Data

(63) Continuation of application No. 12/417,744, filed on Apr. 3, 2009, now Pat. No. 8,059,418.

(51) Int. Cl.
*H05K 5/00* (2006.01)
*H05K 5/06* (2006.01)

(52) U.S. Cl.
CPC ...................................... *H05K 5/066* (2013.01)
USPC ........................................................ 361/752

(58) Field of Classification Search
USPC .................. 361/730, 752, 796, 800, 756, 807
See application file for complete search history.

(56) References Cited

U.S. PATENT DOCUMENTS

| | | | |
|---|---|---|---|
| 5,761,046 A | 6/1998 | Hein et al. | |
| 6,307,752 B1 * | 10/2001 | Howard et al. | 361/752 |
| 6,333,459 B1 * | 12/2001 | Sato et al. | 174/377 |
| 6,552,911 B1 | 4/2003 | Haupt et al. | |
| 6,754,085 B2 | 6/2004 | Kalkbrenner | |
| 6,757,155 B2 * | 6/2004 | Koike et al. | 361/600 |
| 6,850,418 B2 | 2/2005 | Dutton et al. | |
| 6,882,539 B2 * | 4/2005 | Koike et al. | 361/752 |
| 6,972,959 B2 * | 12/2005 | Asai et al. | 361/719 |
| 6,977,337 B1 | 12/2005 | Satullo et al. | |
| 7,394,661 B2 * | 7/2008 | Wang et al. | 361/737 |
| 7,433,196 B1 * | 10/2008 | Wang et al. | 361/752 |
| 7,508,682 B2 * | 3/2009 | Badarinarayan et al. | 361/797 |
| 7,652,417 B2 * | 1/2010 | Yotani et al. | 313/497 |
| 7,729,131 B2 * | 6/2010 | Wang et al. | 361/818 |
| 7,855,893 B2 * | 12/2010 | Pengelly | 361/752 |
| 8,064,221 B2 * | 11/2011 | Kuroda | 361/803 |
| 8,169,779 B2 * | 5/2012 | Le et al. | 361/689 |
| 8,248,809 B2 * | 8/2012 | Miller et al. | 361/752 |
| 2002/0024800 A1 | 2/2002 | Skofljanec | |
| 2003/0063444 A1 | 4/2003 | Kalkbrenner | |
| 2004/0057217 A1 | 3/2004 | Dutton et al. | |
| 2007/0064403 A1 | 3/2007 | Badarinarayan et al. | |
| 2007/0227866 A1 | 10/2007 | Dimig | |
| 2008/0165517 A1 * | 7/2008 | Wang et al. | 361/800 |
| 2009/0059543 A1 * | 3/2009 | Choe et al. | 361/752 |
| 2009/0225522 A1 * | 9/2009 | Mori | 361/752 |
| 2010/0053889 A1 * | 3/2010 | Miller et al. | 361/689 |

* cited by examiner

*Primary Examiner* — Hoa C Nguyen
*Assistant Examiner* — Xanthia C Cunningham
(74) *Attorney, Agent, or Firm* — Tarolli, Sundheim, Covell & Tummino LLP

(57) ABSTRACT

An assembly (10) comprises a housing (11) and a printed circuit board (14) received in the housing. The housing includes a housing body (12) and a cover (16). The housing body (12) has a first surface (26) supporting the printed circuit board (14) and also has a portion defining a second surface (22) receiving the cover (16). At least the portion of the housing body is formed of a material that is meltable by a laser welder. The second surface (22) is spaced from the first surface (26) by a distance that is at least as great as a thickness of the printed circuit board (14). The printed circuit board (14) is at least partially held in place by melted material from said portion.

8 Claims, 5 Drawing Sheets

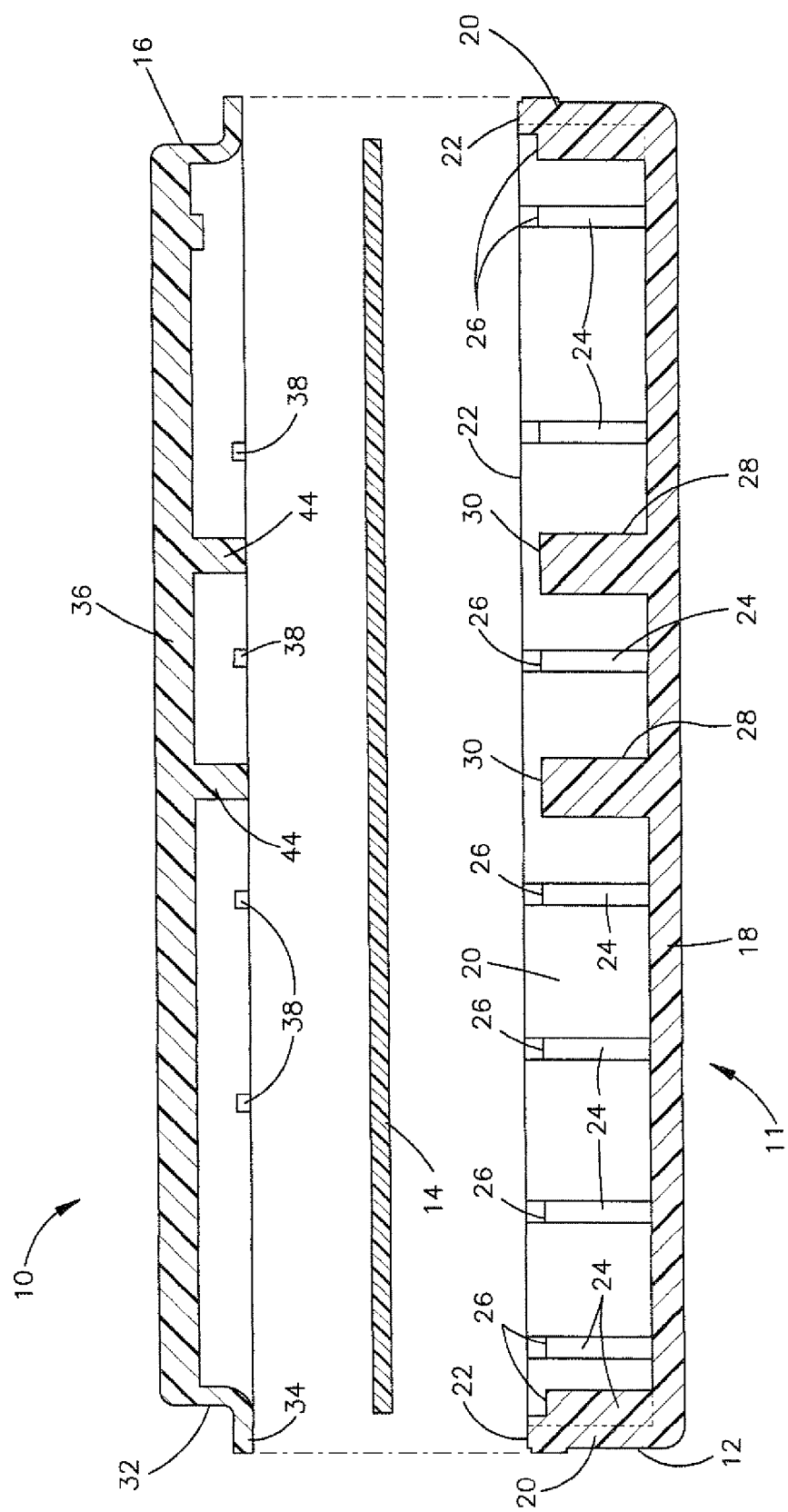

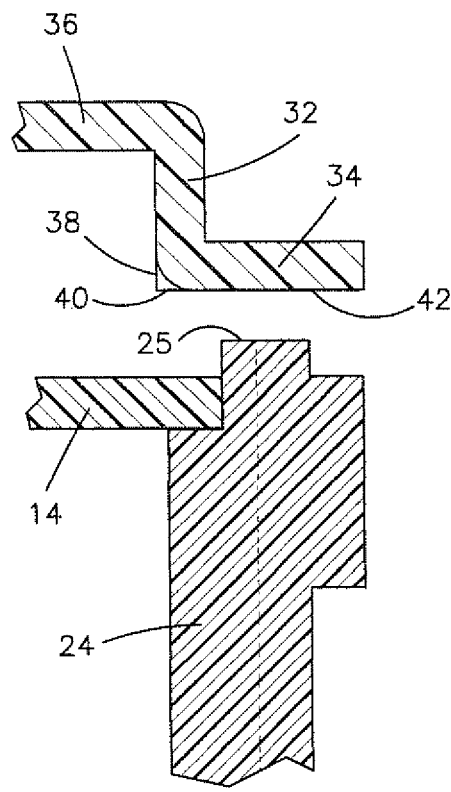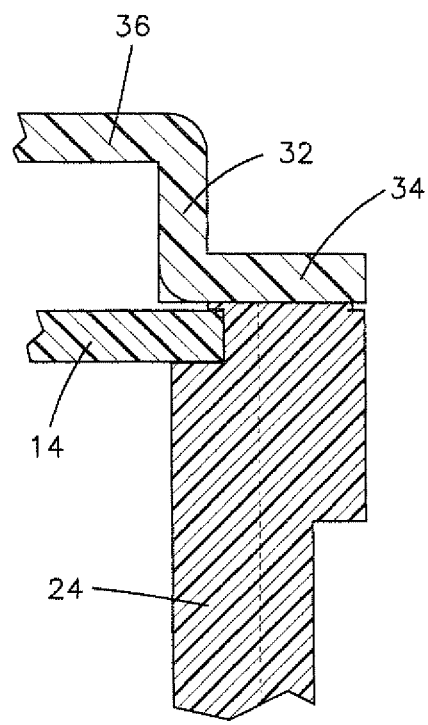
Fig.2A  Fig.2B
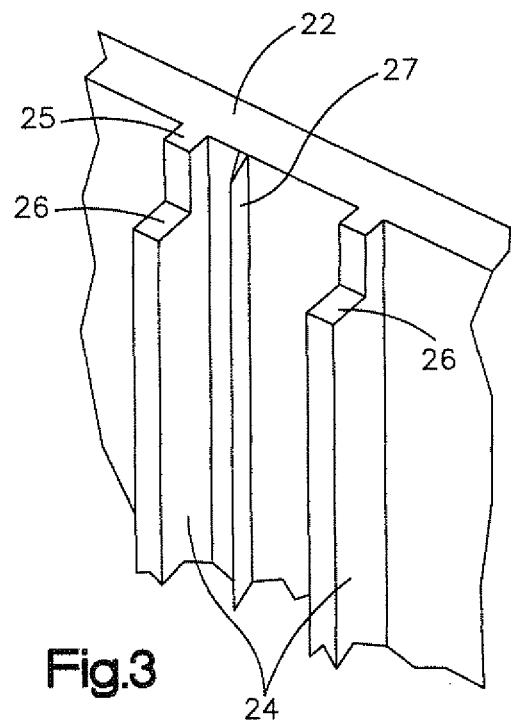
Fig.3

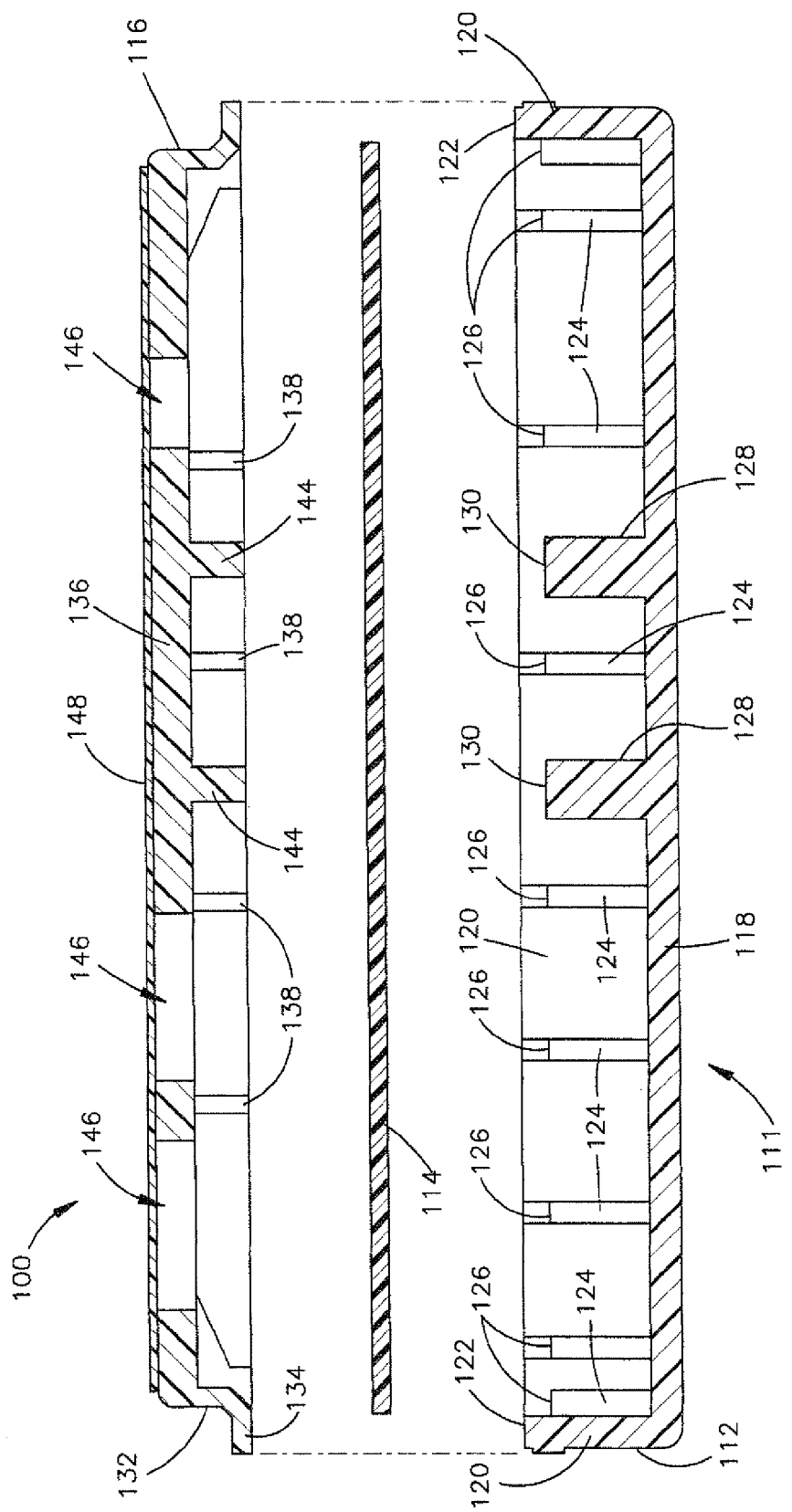

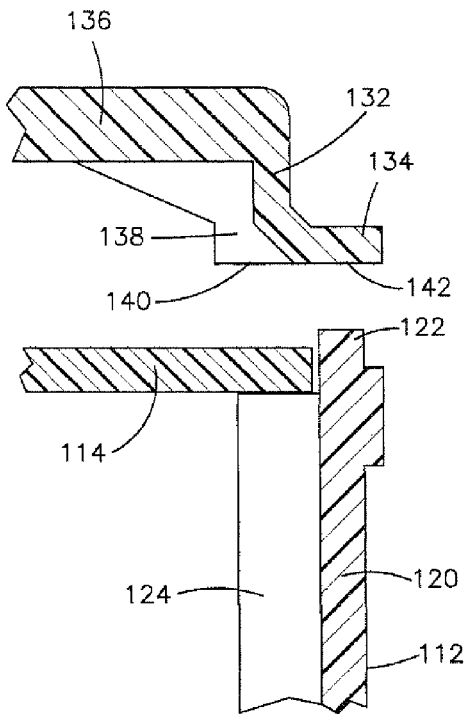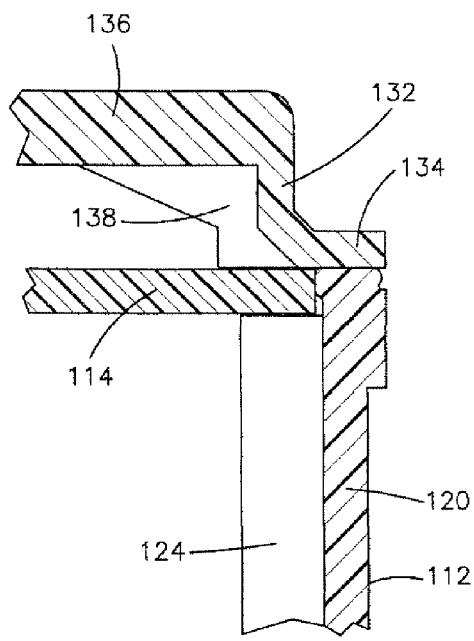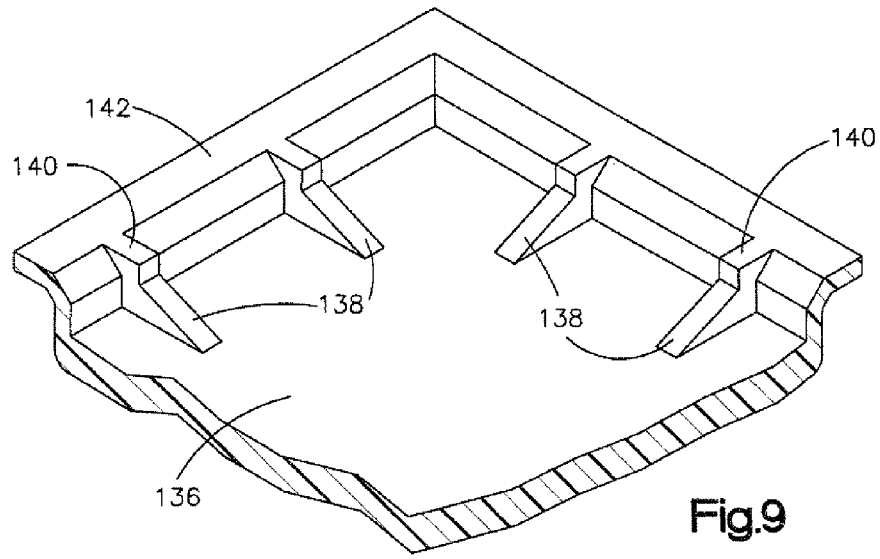

ASSEMBLY WITH A PRINTED CIRCUIT BOARD

CROSS-REFERENCE TO RELATED APPLICATION

This application is a Continuation of U.S. patent application Ser. No. 12/417,744, filed Apr. 3, 2009 now U.S. Pat. No. 8,059,418. The present application claims priority to the aforementioned patent application, which is incorporated in its entirety herein by reference for all purposes.

TECHNICAL FIELD

The present invention relates to an assembly that includes a printed circuit board and, in particular, to an assembly in which a printed circuit board is held in place by material from a housing.

BACKGROUND OF THE INVENTION

It is known to provide an enclosure for an electronic device that includes a printed circuit board ("PCB") secured within the enclosure. For example, electronic modules and sensors for automotive applications often include electronic components mounted on a PCB and enclosed in a multi-piece housing (e.g., a main body portion and a cover). If the main body portion and the cover are both made of plastic, the cover may be secured to the main body portion of the housing by laser welding.

SUMMARY OF THE INVENTION

The present invention is directed to an assembly that includes a printed circuit board and, in particular, to an assembly in which a printed circuit board is held in place by material from a housing.

In accordance with an example embodiment of the invention, an assembly comprises a housing and a printed circuit board received in the housing. The housing includes a housing body and a cover. The housing body has a first surface supporting the printed circuit board and also has a portion defining a second surface receiving the cover. At least the portion of the housing body is formed of a material that is meltable by a laser welder. The second surface is spaced from the first surface by a distance that is at least as great as a thickness of the printed circuit board. The printed circuit board is at least partially held in place by melted material from said portion.

In accordance with another example embodiment of the invention, an assembly comprises a housing and a printed circuit board received in the housing. The housing includes a housing body and a cover. The housing body has a first surface supporting the printed circuit board. The housing body also has a portion defining a second surface receiving the cover. At least the portion of the housing body is formed of a material that is meltable by a laser welder so that the cover is at least partially held in place by melted material from said portion. The cover has a main portion and a third surface that is spaced from the main portion. The third surface is received and supported on the second surface of the housing body. The cover also has a fourth surface that is spaced from the main portion. The fourth surface engages the printed circuit board to help clamp the printed circuit board in the housing. The third surface is spaced from the main portion by a distance that is at least as great as a distance by which the fourth surface is spaced from the main portion.

In accordance with a further example embodiment of the invention, a method is provided for welding an assembly. The method comprises the step of positioning a cover of the assembly on a housing body of the assembly so that a flange of the cover overlies a side wall of the housing body. The method also comprises the steps of positioning a welding head of a laser welder so that a laser beam from the laser welder will contact the flange and turning on the laser welder. The method further comprises the step of moving the welding head so that the laser beam moves in a first direction along the flange above the side wall to melt a first portion of the side wall. The method still further comprises the step of moving the welding head so that the laser beam moves in a second direction along the flange above a support in the housing body to melt a portion of the support. The method yet further comprises the steps of turning off the laser welder and moving the welding head so that the laser beam will contact the flange above the side wall to melt a second portion of the side wall. The method further still comprises the steps of turning on the laser welder and moving the welding head so that the laser beam moves in the first direction along the flange above the side wall to melt the second portion of the side wall.

BRIEF DESCRIPTION OF THE DRAWINGS

The foregoing and other features and advantages of the present invention will become apparent to those skilled in the art to which the present invention relates upon reading the following description with reference to the accompanying drawings, in which:

FIG. 1 is an exploded side sectional view of an assembly constructed in accordance with a first example embodiment of the present invention;

FIGS. 2A and 2B are side sectional views of a portion of the assembly of FIG. 1 at two different steps in the manufacture of the assembly;

FIG. 3 is a perspective view of a portion of a housing body included in the assembly of FIG. 1;

FIG. 7 is an exploded side sectional view of an assembly constructed in accordance with another example embodiment of the present invention;

FIGS. 8A and 8B are side sectional views of a portion of the assembly of FIG. 7 at two different steps in the manufacture of the assembly; and FIG. 9 is a perspective view of a portion of the bottom of a cover included in the assembly of FIG. 7.

DETAILED DESCRIPTION

Figure 4:
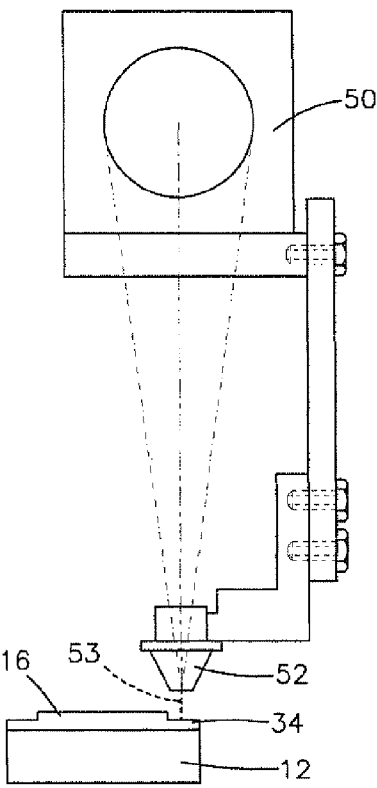
FIG. 4 is a schematic view of a laser welder for use in a process for manufacturing the assembly of FIGS. 1 to 3.

FIGS. 1 through 3 of the drawings illustrate an assembly 10 that is constructed in accordance with a first example embodiment of the present invention. The assembly 10, as shown in FIG. 1, comprises a plastic housing 11 that includes a housing body 12 and a cover 16. The housing body 12 is a one-piece molded plastic unit with a bottom wall 18 and four side walls 20, three of which are shown in FIG. 1. The housing body 12 receives a printed circuit board ("PCB") 14. The plastic cover 16 closes the open top of the housing body 12. The cover 16 may be fastened to the housing body 12 by laser welding, as described in more detail below.

Each side wall 20 may extend substantially vertically, as viewed in FIG. 1, and terminate in a flat upper surface 22. The upper surface 22 receives and supports the cover 16. As best shown in FIGS. 2A and 2B, multiple support ribs 24 project laterally from interior surfaces of the side walls 20. The support ribs 24 may also extend upwardly from the bottom wall 18 of the housing body 12. The support ribs 24 are spaced apart from one another around the side walls 20. Each support rib 24 includes a top surface 25. Adjacent to but spaced from the top surface 25 of each support rib 24 is a flat rib support surface 26 that receives and supports the PCB 14. The rib support surfaces 26 are spaced from the top surfaces 25 and the upper surfaces 22 in a vertical direction, as viewed in FIGS. 1, 2A and 2B. The vertical spacing between the rib support surfaces 26 and the upper surfaces 22 may be at least as great as the thickness of the PCB 14, which is the vertical dimension of the PCB as viewed in FIG. 1.

The housing body 12 may optionally include one or more crush ribs 27. The crush ribs 27 project laterally from interior surfaces of the side walls 20 and extend upwardly from the bottom wall 18 of the housing body 12. As shown in FIG. 3, the crush ribs 27 are spaced apart from one another around the side walls 20 and are also spaced from the support ribs 24. The crush ribs 27 are intended to be crushed laterally or skived as the PCB 14 is installed in the housing body 12. The PCB 14 is thus held against lateral movement despite any potential dimensional tolerances in the PCB and housing body 12 resulting from manufacturing processes.

The housing body 12 may optionally include one or more raised features, such as posts 28, which extend vertically away from an interior surface of the bottom wall 18 of the housing body 12. At the top of each post 28, as viewed in FIG. 1, is a flat post support surface 30, which receives and supports the PCB 14. Each post support surface 30 may be disposed in substantially the same horizontal plane as the rib support surfaces 26 on the support ribs 24 to help ensure that the PCB 14 is evenly supported.

The cover 16 may include a laterally extending main portion 36 and a lip 32. The lip 32 may extend away from the main portion 36 of the cover 16 around the entire periphery of the cover. The lip 32 may extend toward the housing body 12 at an angle of substantially 90° with respect to the main portion 36 of the cover 16. A flange 34 may project from the lip 32 in a direction that is laterally away from the lip and the main portion 36 of the cover 16, as viewed in FIGS. 1, 2A and 2B. The flange 34 may extend away from the lip 32 of the cover 16 at an angle of about 90°. The intersections between the outer surfaces of the lip 32 and the outer surfaces of the flange 34 may be rounded or radiused. The flange 34 may be spaced vertically from the main portion 36 of the cover 16 by the height of the lip 32 and may be oriented substantially parallel to the main portion of the cover. When the assembly 10 is completed, the flange 34 is received and supported on the upper surfaces 22 of the side walls 20 of the housing body 12.

The lip 32 and the flange 34 may be molded in one piece with the main portion 36 of the cover 16. The one-piece molded cover 16 may also include small gussets 38. The gussets 38 are adjacent to and extend between the lip 32 and the flange 34. Each gusset 38 has a flat surface 40 disposed substantially parallel to a surface 42 of the flange 34 and in substantially the same plane as the surface 42. The surface 42 of the flange 34 contacts and is supported on the upper surfaces 22 of the side walls 20 of the housing body 12. The flat surface 40 of each gusset 38 extends away from the flange 34 for a predetermined distance, as explained in greater detail below.

The cover 16 may optionally include one or more contact supports 44, two of which are shown in FIG. 1, to help hold the PCB 14 securely in place without permitting significant movement. The contact supports 44 may be molded in one piece with the cover 16 and project away from an interior surface of the main portion 36 of the cover. The contact supports 44 are positioned to overlie the posts 28 that extend away from the bottom wall 18 of the housing body 12. When the assembly 10 is completed, the PCB 14 is engaged by and clamped between the contact supports 44 in the cover 16 and the post support surfaces 30 of the posts 28.

During manufacture of the assembly 10, the PCB 14 may be placed in the housing body 12 on the rib support surfaces 26 of the support ribs 24 and, if provided, on the post support surfaces 30 of the posts 28. The cover 16 may then be placed over the open top of the housing body 12 with the surface 42 of the flange 34 received on and supported by the upper surfaces 22 of the side walls 20 of the housing body. With the cover 16 in this position, the flat surface 40 of each gusset 38 overlies the PCB 14 for approximately the predetermined distance and may be spaced slightly away from the PCB in a vertical direction, as viewed in FIGS. 1, 2A and 2B.

A laser welder 50 may then be actuated to secure the cover 16 to the housing body 12 and to secure the PCB 14 in the housing to complete the assembly. To facilitate the laser welding process, at least the flange 34 of the cover 16 may be made of a material that is relatively transparent to energy from the laser welder. Conversely, at least the upper portions of the side walls 20 of the housing body 12 may be made of a material that is relatively absorbent with respect to energy from the laser welder.

When the laser welder 50 is actuated, its welding head 52 may move along and above at least the flange 34 of the cover 16. The energy of the laser welder may thus pass through the flange 34 and be absorbed by the upper surfaces 22 of the side walls 20 of the housing body 12. As a result, the material in the side walls 20 adjacent to the upper surfaces 22 may melt and flow toward the PCB 14. The melted material may overlie the peripheral portion of the PCB 14 and fill, at least partially, any space between the periphery of the PCB and the side walls 20 of the housing body 12. When the melted material hardens, it may help both to secure the PCB 14 to the housing body 12 and to secure the cover 16 to the housing body.

Figure 5:
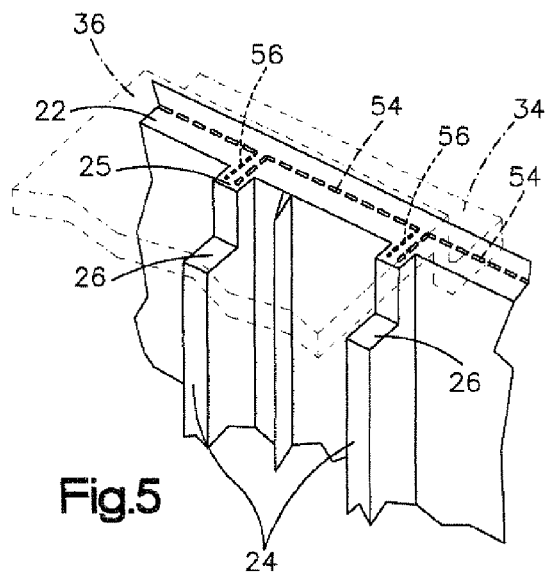
FIG. 5 is a perspective view of a portion of a housing body included in the assembly of FIGS. 1 to 3 marked to show the path of the laser welder of FIG. 4 in manufacturing the assembly of FIGS. 1 to 3.

The overall movement of the welding head 52 of the laser welder 50 may include having the welding head move along and above the flange 34 of the cover 16. The welding head 52 may move from the location of one support rib 24 to the location of the next adjacent support rib, as indicated by the dashed line 54 in FIG. 54 in FIG. 5. At the location of the next adjacent support rib 24, the welding head 52 may make a 90° turn and move along and above the top surface 25 of the support rib. At the end of the top surface 25, the welding head 52 may stop, and the laser welder 50 may shut off. The welding head 52 may then move back along and above the top surface 25 of the support rib 24 to the flange 34 of the cover 16, as indicated by the dotted line 56 in FIG. 5. The laser welder 50 may turn back on, and the welding head 52 may continue to move along and above the flange 34 of the cover to the location of the next support rib 24, as indicated by the dashed line 54 in FIG. 5, and repeat the foregoing movement and operation.

Figure 6:
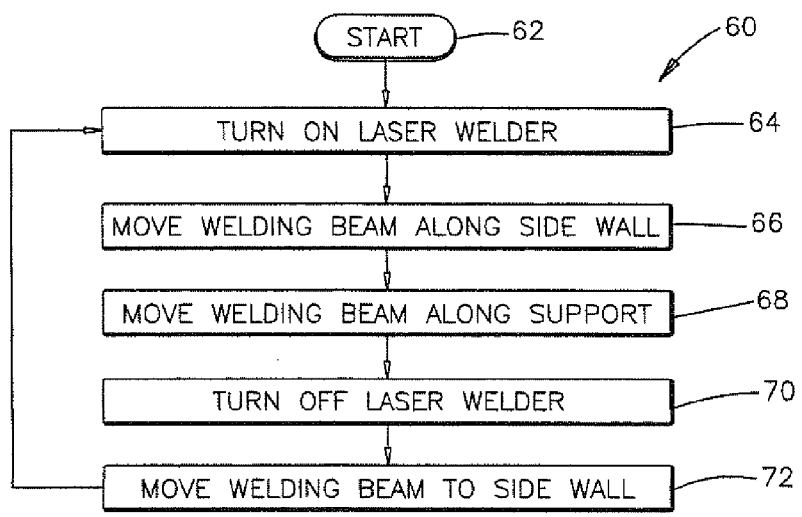
FIG. 6 is a flow chart showing a process used by the welder of FIG. 4 in accordance with an example embodiment of the present invention.

As shown in FIG. 6, an example embodiment of a process 60 according to the present invention begins at step 62 in which the cover 16 of the assembly 10 is positioned on the housing body 12 so that the flange 34 of the cover overlies at least one side wall 20 of the housing body. A welding head of a laser welder may also be positioned above the flange 34 of the cover 16 so that a laser beam 53 from the laser welder will contact the flange. The process 60 then proceeds to step 64 in which the laser welder is turned on. The process 60 next proceeds to step 66 in which the welding head of the welder is moved so that the laser beam 53 moves in a first direction along the flange to melt a first portion of the side wall 20. This step may be carried out by moving the welding head in a first direction along and above the flange 34 of the cover 16 and the upper surface 22 of the side wall 20 of the housing body 12 to melt a first portion of the side wall. Alternatively, this step may be carried out by moving the welding head while the welding head is offset from and disposed at an angle to the flange 34 of the cover 16 or by moving only a portion of the welding head such as a mirror (not shown) or focusing lens (not shown).

The process 60 further proceeds to step 68 in which welding beam 53 makes a turn, such as a 90° turn, at the location of a support rib 24 and moves along moves along the flange 34 of the cover 16 above the support rib to melt a portion of the support rib. This step may be carried out by moving the welding head in a second direction along and above the flange 34 and above the top surface 25 of the support rib 24 to melt a portion of the support rib. Alternatively, this step may be carried out by moving the welding head while the welding head is offset from and disposed at an angle to the flange 34 of the cover 16 or by moving only a portion of the welding head such as a mirror (not shown) or focusing lens (not shown). The process 60 thereafter proceeds to step 70 in which the laser welder is turned off. After step 70, the process proceeds to step 72 in which the welding head is moved in a third direction so that the laser beam, when the laser welder 50 is turned on, will contact the flange 34 above the side wall 20 to melt a second portion of the side wall. This step may be carried out by moving the welding head in a third direction opposite to the second direction back along and above the top surface 25 of the support rib 24 to the flange 34 of the cover 16 and the upper surface 22 of a side wall 20 of the housing body 12. Alternatively, this step may be carried out by moving the welding head while the welding head is offset from and disposed at an angle to the flange 34 of the cover 16 or by moving only a portion of the welding head such as a mirror (not shown) or focusing lens (not shown).

From step 72, the process 60 returns to step 64 in which the laser welder is turned on again, and the process repeats steps 66 through 72 until, for example, the cover 16 is attached to the housing body 12 to the extent desired by melted material from the side wall 20 and, if desired, melted material from one or more additional side walls of the housing body 12. Alternatively, the PCB 14 may be attached to the housing body 12 by melted material from the support rib 24 and, if desired, melted material from one or more additional support ribs.

The amount of material required to secure the PCB 14 to the housing body 12 and secure the cover 16 to the housing body at least partially determines the difference between the relative vertical positions of the upper surfaces 22 of the side walls 20 and the rib support surfaces 26 of the support ribs 24. Generally, the greater the amount of material required, the greater the difference between the vertical positions of the upper surfaces 22 and the rib support surfaces 26. At the same time, the amount of melted material may be controlled to minimize or avoid contact between the melted material and components mounted on the PCB 14. Also, to help control the outcome of the laser welding process, the flat surfaces 40 of the gussets 38 may act as stops. The flat surfaces 40 of the gussets 38 may engage or contact the peripheral portion of the PCB 14 or the melted material from the side walls 20 on the peripheral portion of the PCB so as to limit downward movement of the cover 16.

FIGS. 7 through 9 of the drawings illustrate an assembly 100 that is constructed in accordance with a second example embodiment of the present invention. The assembly 100, as shown in FIG. 7, comprises a plastic housing 111 that includes a housing body 112 and a cover 116. The housing body 112 may be a one-piece molded plastic unit with a bottom wall 118 and four side walls 120, three of which are shown in FIG. 7. The housing body 112 receives a printed circuit board ("PCB") 114. The plastic cover 116 closes the open top of the housing body 112. The cover 116 may be fastened to the housing body 112 by laser welding, as described in more detail below.

Each side wall 120 may extend substantially vertically, as viewed in FIG. 7, and terminate in a flat upper surface 122. The upper surface 122 receives and supports the cover 116. As best shown in FIGS. 8A and 8B, multiple support ribs 124 project laterally from interior surfaces of the side walls 120. The support ribs 124 may also extend upwardly from the bottom wall 118 of the housing body 112. The support ribs 124 are spaced apart from one another around the side walls 120. Each support rib 124 includes a top surface that is a flat rib support surface 126, which receives and supports the PCB 114. The rib support surfaces 126 are spaced from the upper surfaces 122 of the side walls 120 in a vertical direction, as viewed in FIGS. 7, 8A and 8B. The vertical spacing between the rib support surfaces 126 and the upper surfaces 122 may be at least as great as the thickness of the PCB 114, which is the vertical dimension of the PCB as viewed in FIG. 7.

The housing body 112 may optionally include one or more raised features, such as posts 128 that extend vertically away from an interior surface of the bottom wall 118 of the housing body 112. At the top of each post 128, as viewed in FIG. 7, is a flat post support surface 130, which receives and supports the PCB 114. Each post support surface 130 may be disposed in substantially the same horizontal plane as the rib support surfaces 126 on the support ribs 124 to help ensure that the PCB 114 is evenly supported.

The cover 116 may include a laterally extending main portion 136 and a lip 132. The lip 132 may extend away from the main portion 136 of the cover 116 around the entire periphery of the cover. The lip 132 may extend toward the housing body 112 at an angle of substantially 90° with respect to the main portion 136 of the cover 116. A flange 134 may project from the lip 132 in a direction that is laterally away from the lip and the main portion 136 of the cover 116, as viewed in FIGS. 7, 8A and 8B. The flange 134 may extend away from the lip 132 of the cover 116 at an angle of about 90°. The intersections between the outer surfaces of the lip 132 and the outer surfaces of the flange 134 may be angled, as shown in FIGS. 8A, 8B and 9, or may be rounded or radiused. The flange 134 may be spaced vertically from the main portion 136 of the cover 116 by the height of the lip 132 and may be oriented substantially parallel to the main portion of the cover. When the assembly 100 is completed, the flange 134 is received and supported on the upper surfaces 122 of the side walls 120 of the housing body 112.

The lip 132 and the flange 134 may be molded in one piece with the main portion 136 of the cover 116. The one-piece molded cover 116 may also include gussets 138. The gussets 138 are adjacent to and extend between the lip 132 and the main portion 136 of the cover on a side of the lip away from the flange 134. Each gusset 138 has a flat surface 140 disposed substantially parallel to a surface 142 of the flange 134 and in substantially the same plane as the surface 142. The surface 142 of the flange 134 contacts and is supported on the upper surfaces 122 of the side walls 120 of the housing body 112. The flat surface 140 of each gusset 138 extends away from the flange 134 and the lip 132 for a predetermined distance, as explained in greater detail below.

The cover 116 may optionally include one or more contact supports 144, two of which are shown in FIG. 7, to help hold the PCB 114 securely in place without permitting significant movement. The contact supports 144 may be molded in one piece with the cover 116 and project away from an interior surface of the main portion 136 of the cover. The contact supports 144 are positioned to overlie the posts 128 that extend away from the bottom wall 118 of the housing body 112. When the assembly 100 is completed, the PCB 114 is engaged by and clamped between the contact supports 144 in the cover 116 and the post support surfaces 130 of the posts 128.

The cover 116 may also optionally include one or more openings or windows 146, three of which are shown in FIG. 7, to permit components on the PCB 114 to be viewed and/or manipulated. As shown, the openings or windows 146 may be covered with a transparent or translucent film 148 or other covering material to restrict or prohibit undesired substances, such as dirt, from entering the housing 111. If the windows 146 are intended to permit components on the PCB 114 to be manipulated, the film 148 may be flexible to permit such manipulation. The film 148 may be secured to the cover 116 with, for example, adhesive.

During manufacture of the assembly 100, the PCB 114 may be placed in the housing body 112 on the rib support surfaces 126 of the support ribs 124 and, if provided, on the post support surfaces 130 of the posts 128. The cover 116 may then be placed over the open top of the housing body 112 with the surface 142 of the flange 134 received on and supported by the upper surfaces 122 of the side walls 120 of the housing body 112. With the cover 116 in this position, the flat surface 140 of each gusset 138 overlies the PCB 114 for approximately the predetermined distance and may be spaced slightly away from the PCB in a vertical direction, as viewed in FIGS. 7, 8A and 8B A laser welder (not shown) may then be actuated to secure the cover 116 to the housing body 112 and to secure the PCB 114 in the housing to complete the assembly. To facilitate the laser welding process, at least the flange 134 of the cover 116 may be made of a material that is relatively transparent to energy from the laser welder. Conversely, at least the upper portions of the side walls 120 of the housing body 112 may be made of a material that is relatively absorbent with respect to energy from the laser welder.

When the laser welder is actuated, its welding head (not shown) may move along and above the flange 134 of the cover 116. The energy of the laser welder may thus pass through the flange 134 and be absorbed by the upper surfaces 122 of the side walls 120 of the housing body 112. As a result, the material in the side walls 120 adjacent to upper surfaces 122 may melt and flow toward the PCB 114. The melted material may overlie the peripheral portion of the PCB 114 and fill, at least partially, any space between the periphery of the PCB and the side walls 120 of the housing body 112. When the melted material hardens, it may help both to secure the PCB 114 to the housing body 112 and to secure the cover 116 to the housing body.

The amount of material required to secure the PCB 114 to the housing body 112 and secure the cover 116 to the housing body at least partially determines the difference between the relative vertical positions of the upper surfaces 122 of the side walls 120 and the rib support surfaces 126 of the support ribs 124. Generally, the greater the amount of material required, the greater the difference between the vertical positions of the upper surfaces 122 and the rib support surfaces 126. At the same time, the amount of melted material may be controlled to minimize or avoid contact between the melted material and components mounted on the PCB 114.

Also, to help control the outcome of the laser welding process, the flat surfaces 140 of the gussets 138 may act as stops. The flat surfaces 140 of the gussets 138 may engage or contact the peripheral portion of the PCB 114 or the melted material from the side walls 120 on the peripheral portion of the PCB so as to limit downward movement of the cover 116. If the dimensions of the cover 116, the PCB 114, and the housing body 112 are controlled, it may also be possible to clamp the PCB between the flat surfaces 140 of the gussets 138 and the rib support surfaces 126 of the support ribs 124 without having significant or, potentially, any melted material from the side walls 120 on the PCB In this regard, the greater lateral extent of the flat surfaces 140 as compared to the flat surfaces 40 of FIGS. 1-3 may facilitate clamping of the PCB. If melted material from the side wails 120 is not intended to contribute significantly to holding the PCB 114 in place, the relative positions of the upper surfaces 122 and the rib support surfaces 126 and the relative positions of the surfaces 140 and 142 may be changed from the positions illustrated in FIGS. 7-9. Specifically, the vertical spacing between the upper surfaces 122 and the rib support surfaces 126 may be decreased so that the PCB projects above the upper surfaces 122. Correspondingly, the vertical spacing between the surfaces 140 and 142 may be increased so that the flat surfaces 140 lie closer to the main portion 136 of the cover 116 than the surface 142 to accommodate the relatively higher position of the upper surface of the PCB 114 in the housing body 112.

From the above description of the invention, those skilled in the art will perceive improvements, changes and modifications. Such improvements, changes and modifications within the skill of the art are intended to be covered by the appended claims.

Having described the invention, the following is claimed:

1. An assembly comprising a housing, a printed circuit board received in the housing, and a cover, the housing including a housing body having (a) a cover support surface and (b) a printed circuit board support surface that is recessed from said cover support surface by a distance that is at least as great as a thickness of the printed circuit board and within an interior of the housing body, the housing body including a bottom wall and a side wall extending upwardly from the bottom wall, the housing body also including a plurality of spaced ribs projecting inwardly from the side wall and upwardly from the bottom wall, each rib having a top surface and a rib support surface adjacent to and spaced vertically from the top surface, the printed circuit board support surface including the rib support surfaces of the plurality of spaced ribs, the printed circuit board being in contact with the rib support surfaces, the side wall including an upper surface spaced vertically from the bottom wall and from the rib support surfaces of the plurality of spaced ribs, at least a portion of the housing body being formed of a material that is meltable, the printed circuit board being at least partially held in place in the housing body by melted material from said portion, the melted material contacting the printed circuit board and being at least one of (a) material from the side wall adjacent the upper surface and (b) material from the ribs.

2. The assembly of claim 1 wherein the melted material is melted using a laser.

3. The assembly of claim 1 wherein the cover is joined to the housing body by the melted material.

4. The assembly of claim 1 wherein at least one projection is formed on an interior surface of the housing body to engage the printed circuit board and help clamp the printed circuit board in the housing.

5. The assembly of claim 1 wherein at least one projection is formed on the cover to engage the printed circuit board and help clamp the printed circuit board in the housing.

6. The assembly of claim 1 wherein said portion of the housing body defines the cover support surface.

7. The assembly of claim 1 wherein the cover support surface includes the upper surface of the side wall, the cover being in contact with the upper surface of the side wall.

8. The assembly of claim 1 wherein the melted material overlies the printed circuit board.

* * * * *